(12) United States Patent
Zhang et al.

(10) Patent No.: US 10,777,477 B2
(45) Date of Patent: Sep. 15, 2020

(54) CHIP PACKAGING STRUCTURE, AND PACKAGING METHOD THEREOF

(71) Applicant: JIANGYIN CHANGDIAN ADVANCED PACKAGING CO., LTD, Jiangsu (CN)

(72) Inventors: Li Zhang, Jiangsu (CN); Hong Xu, Jiangsu (CN); Dong Chen, Jiangsu (CN); Jinhui Chen, Jiangsu (CN); Zhiming Lai, Jiangsu (CN); Qicai Chen, Jiangsu (CN)

(73) Assignee: JIANGYIN CHANGDIAN ADVANCED PACKAGING CO., LTD, Jiangsu (CN)

( * ) Notice: Subject to any disclaimer, the term of this patent is extended or adjusted under 35 U.S.C. 154(b) by 0 days.

(21) Appl. No.: 16/330,765

(22) PCT Filed: Dec. 12, 2016

(86) PCT No.: PCT/CN2016/109499
§ 371 (c)(1),
(2) Date: Mar. 6, 2019

(87) PCT Pub. No.: WO2018/103117
PCT Pub. Date: Jun. 14, 2018

(65) Prior Publication Data
US 2019/0214324 A1 Jul. 11, 2019

(30) Foreign Application Priority Data
Dec. 6, 2016 (CN) .......................... 2016 1 1107747

(51) Int. Cl.
*H01L 23/31* (2006.01)
*H01L 21/56* (2006.01)
(Continued)

(52) U.S. Cl.
CPC ...... *H01L 23/3114* (2013.01); *H01L 21/4853* (2013.01); *H01L 21/56* (2013.01);
(Continued)

(58) Field of Classification Search
CPC ... H01L 21/4853; H01L 21/56; H01L 21/561; H01L 21/565; H01L 21/568;
(Continued)

(56) References Cited

U.S. PATENT DOCUMENTS 10,541,201 B2 * 1/2020 Lee ..................... H01L 23/5386
2004/0043548 A1 3/2004 Redd
(Continued)

FOREIGN PATENT DOCUMENTS

| CN | 104795380 | 7/2015 |
| CN | 204464263 | 7/2015 |
| CN | 205303448 | 6/2016 |

OTHER PUBLICATIONS

"International Search Report (Form PCT/ISA/210)", dated Aug. 22, 2017, with English translation thereof, pp. 1-4.

*Primary Examiner* — Stephen W Smoot
(74) *Attorney, Agent, or Firm* — JCIP Global Inc.

(57) ABSTRACT

The present invention provides a chip packaging structure, and a packaging method thereof. The structure comprises a silicon-based main body and chip electrodes. The silicon-based main body is provided with a passivation layer on a front face thereof and passivation layer openings are provided on the passivation layer. The chip electrodes have rear faces embedded in the front face of the silicon-based main body. Front faces of the chip electrodes are exposed through the passivation layer openings. A dielectric layer is provided on an upper surface of the passivation layer, and dielectric layer openings are provided. Metal protrusion structures are provided on the front faces of the chip electrodes. An
(Continued)

encapsulation layer is provided on side walls and a rear face of the silicon-based main body. The chip packaging structure of the present invention employs insulation protection on side walls to avoid electrical leakage and short circuit conditions.

16 Claims, 7 Drawing Sheets

(51) Int. Cl.
    *H01L 21/683*    (2006.01)
    *H01L 23/00*    (2006.01)
    *H01L 21/78*    (2006.01)
    *H01L 23/488*    (2006.01)
    *H01L 21/48*    (2006.01)

(52) U.S. Cl.
    CPC ........ *H01L 21/565* (2013.01); *H01L 21/6835* (2013.01); *H01L 21/6836* (2013.01); *H01L 21/78* (2013.01); *H01L 23/3135* (2013.01); *H01L 23/3171* (2013.01); *H01L 23/3185* (2013.01); *H01L 23/488* (2013.01); *H01L 24/11* (2013.01); *H01L 24/13* (2013.01); *H01L 24/14* (2013.01); *H01L 24/96* (2013.01); *H01L 2221/68327* (2013.01); *H01L 2224/11* (2013.01); *H01L 2224/1145* (2013.01); *H01L 2224/1147* (2013.01); *H01L 2224/11462* (2013.01); *H01L 2224/11464* (2013.01); *H01L 2224/13101* (2013.01); *H01L 2924/10253* (2013.01)

(58) Field of Classification Search
    CPC ............. H01L 23/3114; H01L 23/3135; H01L 23/3171; H01L 23/3185; H01L 23/488; H01L 24/11; H01L 24/13; H01L 24/14; H01L 24/94; H01L 24/96; H01L 2224/0401; H01L 2224/04105; H01L 2224/05572; H01L 2224/12105; H01L 2224/13082; H01L 2224/131; H01L 2224/13101; H01L 2224/81815; H01L 2224/94; H01L 2924/10253
    See application file for complete search history.

(56) References Cited

U.S. PATENT DOCUMENTS

| | | | |
|---|---|---|---|
| 2008/0191339 A1* | 8/2008 | Otremba | H01L 23/291 257/702 |
| 2008/0315424 A1* | 12/2008 | Lee | H01L 23/3114 257/762 |
| 2009/0286357 A1 | 11/2009 | Beer | |
| 2012/0217628 A1* | 8/2012 | Chou | H01L 23/3677 257/692 |
| 2012/0220082 A1* | 8/2012 | Ng | H01L 21/561 438/124 |
| 2015/0130047 A1* | 5/2015 | Tseng | H01L 23/3736 257/713 |
| 2016/0372446 A1* | 12/2016 | Keser | H01L 24/20 |
| 2018/0182727 A1* | 6/2018 | Yu | H01L 24/19 |
| 2018/0190617 A1* | 7/2018 | Chew | H01L 23/481 |

\* cited by examiner

CHIP PACKAGING STRUCTURE, AND PACKAGING METHOD THEREOF

CROSS-REFERENCE TO RELATED APPLICATION

This is a 371 application of the International PCT application serial no. PCT/CN2016/109499, filed on Dec. 12, 2016, which claims the priority benefits of China Application No. 201611107747.2, filed on Dec. 6, 2016. The entirety of each of the above-mentioned patent applications is hereby incorporated by reference herein and made a part of this specification.

BACKGROUND OF THE INVENTION

Field of the Invention

The present invention relates to the technical field of semiconductor packaging, and in particular, to a chip packaging structure and a packaging method thereof.

Description of Related Art

Figure 1:
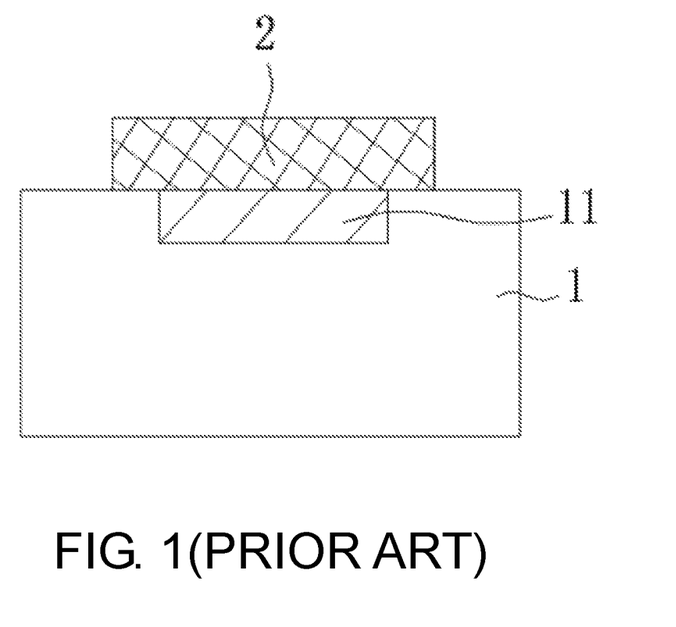
FIG. 1 is a schematic sectional view of an existing chip packaging structure.

With the development of a semiconductor silicon process, a chip size is increasingly small, and the Chip Scale Package is the mainstream. However, some packaging structures do not use a BGA array structure, but use a planar pad structure similar to a conventional QFN or LGA. Since a silicon substrate is made of a semiconductor material, a silicon-based main body 1 around a chip of the silicon substrate is exposed in an assembly environment. As shown in FIG. 1, in a surface-mounting and reflow process, due to excessive printing of a solder paste 2 in an electrode area 11, some solder can climb up to exposed silicon on side walls of the silicon-based main body 1, causing electrical leakage and short circuit conditions of the chip; or because of a relatively small chip spacing, after heating or reflowing, side walls of the chip can come into contact with a metal protrusion of another chip, leading to a failure.

SUMMARY OF THE INVENTION

Technical Problem

An objective of the present invention is to overcome the foregoing disadvantages, and provide a chip packaging structure and a packaging method thereof. The chip packaging structure employs insulation protection on side walls to avoid electrical leakage and short circuit conditions, thus increasing reliability and improving the pass rate of chip mounting.

Technical Solution

The objective of the present invention is achieved as follows.

The present invention provides a chip packaging structure and a packaging method thereof. The structure includes a silicon-based main body and chip electrodes. The silicon-based main body is provided with a passivation layer and passivation layer openings on a front face thereof. The chip electrodes have rear faces embedded in the front face of the silicon-based main body. The passivation layer opening exposes front faces of the chip electrodes.

A dielectric layer is provided on an upper surface of the passivation layer, and dielectric layer openings are provided. The front faces of the chip electrodes are also exposed through the dielectric layer openings.

Metal protrusion structures are provided on the front faces of the chip electrodes, and are fixedly connected to the chip electrodes. The metal protrusion structure sequentially includes a metal seed layer, a metal column, and a solder layer from bottom to top.

An angle between a side wall of the silicon-based main body and a horizontal plane in which the chip electrodes are located is $\alpha$, and a value range of the angle $\alpha$ is $60°\leq\alpha\leq120°$. A conductivity-enhancing layer and an encapsulation layer are provided on a rear face of the silicon-based main body. The conductivity-enhancing layer is adhered to the rear face of the silicon-based main body. The encapsulation layer covers the conductivity-enhancing layer and covers the rear face and side walls of the silicon-based main body which are exposed. The encapsulation layer is integrally formed, and is in a sealed connection to the dielectric layer at an interface between the encapsulation layer and the dielectric layer.

The total thickness H of the chip packaging structure ranges from 50 to 300 micrometers.

Further, a sealed connection structure is provided at the interface between the encapsulation layer and the dielectric layer, and the sealed connection structure has a dot shape, a zigzag shape, or a step shape on the dielectric layer and/or the silicon-based main body.

Further, the conductivity-enhancing layer sequentially includes a metal seed layer and a conductive metal layer from top to bottom.

Further, the conductivity-enhancing layer is made of a conductive polymer material or a conductive nanomaterial.

Further, the conductivity-enhancing layer completely covers the rear face of the silicon-based main body.

Further, the conductivity-enhancing layer partially covers the rear face of the silicon-based main body, and is formed into a plurality of concentric rings or a plurality of stripes.

The present invention provides a packaging method of a chip packaging structure, including steps of:

step 1: obtaining an integrated circuit wafer, where chip electrodes and a corresponding circuit layout are provided on a surface thereof, and passivation layer openings are provided, above the chip electrodes, on a passivation layer covering an upper surface of the wafer and front faces of the chip electrodes are exposed through the openings;

step 2: providing a dielectric layer on a surface of the wafer and making dielectric layer openings on the dielectric layer by using a photolithography process, where the front faces of the chip electrodes are exposed through the dielectric layer openings;

step 3: depositing a metal seed layer on the surface of the wafer by using a sputtering method or an electroless plating method, then providing metal columns on the front faces of the chip electrodes and solder layers at the top of the metal columns by sequentially using a photolithography process and an electroplating process, removing a remaining photoresist, and removing through corrosion the metal seed layer which is outside the extent of metal columns and useless, to form metal protrusion structures;

step 4: performing temporary bonding, on a front face of the wafer, of a support having the same size as the front face of the wafer, where the support is a silicon-based reinforcing plate or a glass-based support;

step 5: performing a thinning process on a rear face of the wafer by using a physical grinding method or a wet etching method, where a thickness by which the wafer is thinned is determined according to an actual situation;

step 6: forming a conductivity-enhancing layer 13 on the rear face of the thinned wafer by using an evaporation method or a printing method;

step 7: forming recesses along the direction of scribe lines by sequentially using photolithography, dry or wet etching, and photoresist stripping processes, where a position of the bottom of the recess is lower than the bottom of a circuit of the chip electrode in a vertical direction, an angle between a wall and the bottom of the recess is β, and a value range of the angle β is $60°≤β≤120°$;

step 8: in a vacuum, on the rear face of the wafer on which the recesses are formed, inject molding an encapsulation material, or coating an encapsulation film by using a film coating process, to form an encapsulation layer, where the encapsulation layer completely covers side walls and a rear face of a silicon-based main body;

step 9: forming a rear face protective layer on a rear face of the encapsulation layer by using a printing process or a film coating process;

step 10: removing the bonded support, and cleaning an upper surface of the packaging structure in the step 3, to remove a residue, and expose the front face of the wafer and the metal protrusion structures; and step 11: cutting the packaging structure in the foregoing step along the scribe lines again, to form a plurality of independent packaging units.

Further, in the step 7, the recesses penetrate the wafer in a depth direction, to divide the wafer into a plurality of silicon-based main bodies.

Further, in the step 7, after forming the recesses, the method further includes a step of: forming a sealed connection structure having a dot shape, a zigzag shape, or a step shape at the bottom and/or on a wall of the recess by using a laser process or an etching process.

Advantageous Effect

Advantageous effects of the present invention are as follows:

1) The chip packaging structure packaged in the present invention employs insulation protection on side walls, to avoid electrical leakage and short circuit conditions caused because solder climbs up to exposed silicon on the side walls of the silicon-based main body, thus increasing reliability and improving the pass rate of a chip.

2) The height of the metal column of the chip packaging structure achieved in the present invention is further reduced, and a bare design is used; and the encapsulation layer provided in the surrounding and on the rear face of the silicon-based main body is integrally formed, so that the structure is simple, design difficulty is reduced, and manufacturing costs are reduced.

3) In the present invention, by providing the recesses on the rear face of the wafer to divide the wafer into individual chip units, and employing a protection technique in the surrounding and rear faces of the individual chip units, the method eliminates wafer reconfiguration, and effectively improves production efficiency for small-sized chips, thus reducing costs.

4) The temporary bonding technique used in the present invention resolves a problem of picking and placing a thin wafer, facilitates integrated development of a portable electronic device, and achieves a miniaturized, thinned, and light-weight packaging structure.

IN THE FIGURES

Wafer 100
Silicon-based main body 1
Chip electrode 11
Passivation layer 12
Passivation layer opening 121
Conductivity-enhancing layer 13
Encapsulation layer 3
Dielectric layer 4
Dielectric layer opening 41
Metal protrusion structure 5
Metal seed layer 51
Metal column 53
Solder layer 55
Support 6
Temporary bonding adhesive 61
Temporary bonding film 63
Recess 7
Rear face protective layer 8

DETAILED DESCRIPTION OF THE INVENTION

Figure 2:
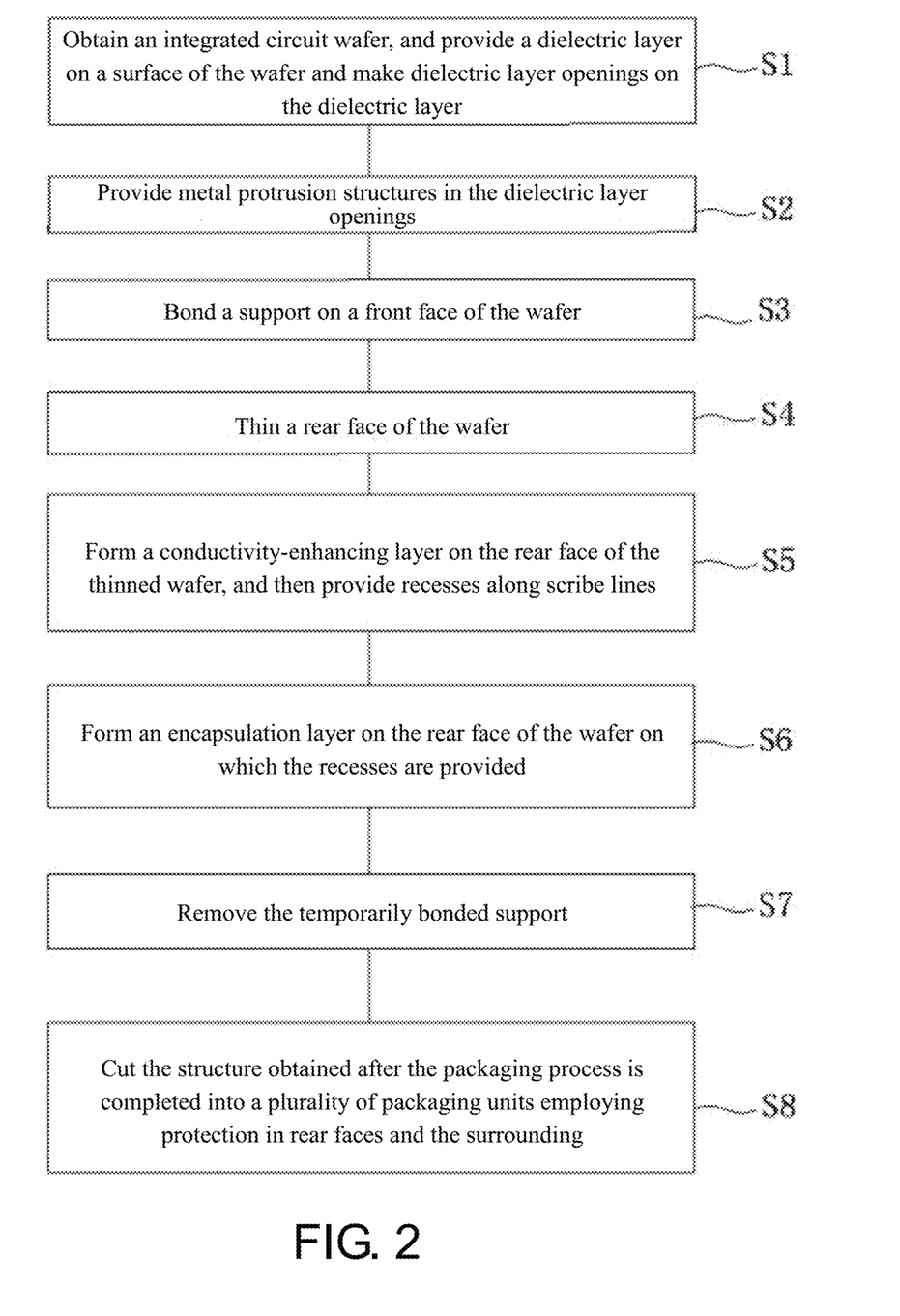
FIG. 2 is a flow diagram of a chip packaging structure and a packaging method thereof according to the present invention.

Referring to FIG. 2, a process flow of a chip packaging structure and a packaging method thereof of the present invention includes:

S1: obtain an integrated circuit wafer, provide a dielectric layer and make dielectric layer openings on a surface of the wafer;

S2: provide metal protrusion structures in the dielectric layer openings;

S3: bond a support on a front face of the wafer;

S4: thin a rear face of the wafer;

S5: form a conductivity-enhancing layer on the rear face of the thinned wafer, and then provide recesses along scribe lines;

S6: form an encapsulation layer on the rear face of the wafer on which the recesses are provided;

S7: remove the temporarily bonded support; and

S8: cut the structure obtained after the packaging process is completed into a plurality of packaging units employing protection in rear faces and the surrounding.

The present invention is now more fully described below with reference to the accompanying drawings, and exemplary embodiments of the present invention are shown in the accompanying drawings, to fully convey the scope of the present invention to a person skilled in the art in the present disclosure. However, the present invention may be implemented in many different forms, and it should not be construed as that the present invention is limited to the embodiments described herein.

Figure 3A:
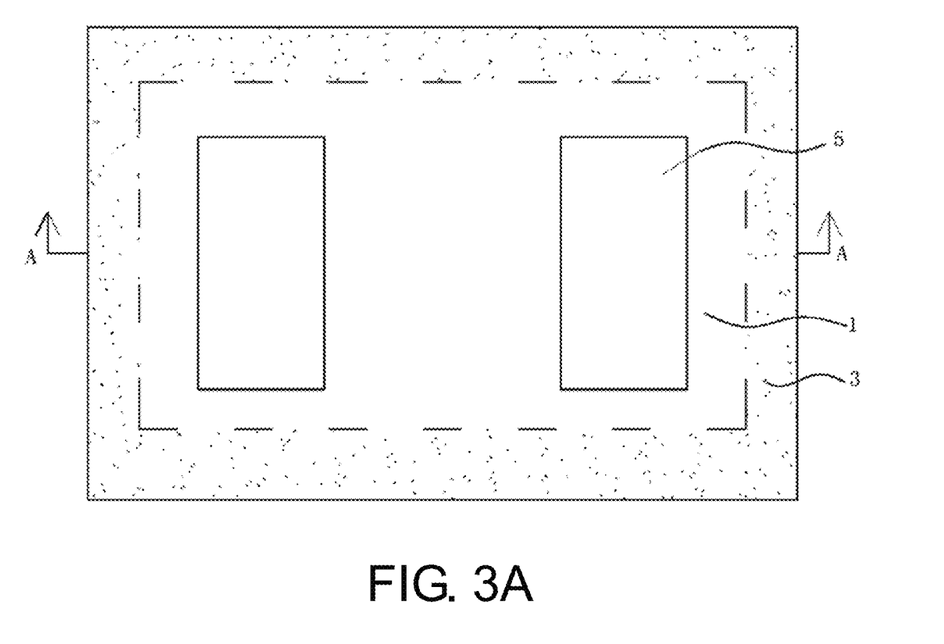
FIG. 3A is a schematic front view of an embodiment of a chip packaging structure according to the present invention.
Figure 3B:
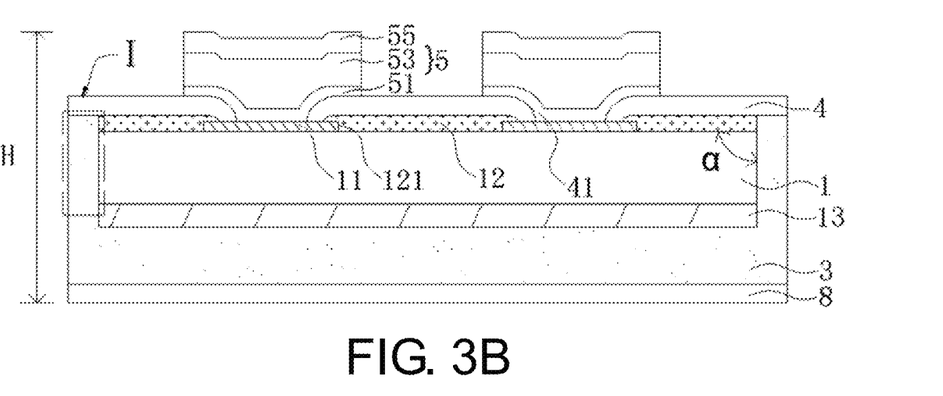
FIG. 3B is a schematic sectional view along A-A of FIG. 3A.

For a specific embodiment, refer to FIG. 3A and FIG. 3B.

FIG. 3A is a schematic front view of an embodiment of a chip packaging structure according to the present invention.

FIG. 3B is a schematic sectional view along A-A of the embodiment in FIG. 3A. The chip packaging structure is provided with a passivation layer 12 and passivation layer openings 121 on a front face of a silicon-based main body 1 thereof. There are at least two chip electrodes 11, where one electrode is a negative electrode. As shown in FIG. 3A, the chip electrodes 11 are regularly arranged. The chip electrodes 11 have rear faces embedded in the front face of the silicon-based main body 1. Front faces of the chip electrodes 11 are exposed through the passivation layer openings 121.

A dielectric layer 4 is provided on an upper surface of the passivation layer 12, and dielectric layer openings 41 are provided. The dielectric layer opening 41 is slightly smaller than the passivation layer opening 121. The front faces of the chip electrodes 11 are also exposed through the dielectric layer openings 41.

Metal protrusion structures 5 are provided on the front faces of the chip electrodes 11. The metal protrusion structure 5 sequentially includes a metal seed layer 51, a metal column 53, and a solder layer 55 from bottom to top. The metal column 53 uses a bare design. Generally, the thickness of the metal column 53 ranges from 3 to 10 micrometers. To avoid a solder climbing phenomenon in an electrode area in a surface-mounting and reflow process, the height of the metal protrusion structure 5 achieving a connection and fixing function only needs to be slightly greater than the height of the dielectric layer 4, and preferably, the thickness of the metal column 53 ranges from 3-5 micrometers. As shown in FIG. 3B, the height of the metal protrusion structure 5 is minimized to reduce manufacturing costs, and the simple packaging structure also reduces process difficulty and improves packaging reliability.

An angle between a side wall of the silicon-based main body 1 and a horizontal plane in which the chip electrodes 11 are located is $\alpha$, and a value range of the angle $\alpha$ is $60°\leq\alpha\leq120°$. As shown in FIG. 3B, $\alpha=90°$. Preferably, when $90°\leq\alpha\leq120°$, the silicon-based main body 1 has a trapezoidal shape, to improve the overall stability of the packaging structure and the reliability of electrical performance. An encapsulation layer 3 is provided on four side walls and a rear face of the silicon-based main body 1. The encapsulation layer 3 is formed from an encapsulation material capable of achieving waterproof, damp-proof, quakeproof, dustproof, heat dissipation, and insulation functions and the like. Preferably, the encapsulation layer 3 is integrally formed. The encapsulation layer 3 is in a sealed connection to the dielectric layer 4 at an interface between the encapsulation layer 3 and the dielectric layer 4. Generally, a sealed connection structure is provided at the interface between the encapsulation layer 3 and the dielectric layer 4, and an interface between the encapsulation layer 3 and the silicon-based main body 1. Referring to an area I in FIG. 3B, the sealed connection structure has a dot shape, a zigzag shape, a step shape, or the like, to increase connection strength at the interface.

Because of the encapsulation layer 3, the four side walls and the rear face of the silicon-based main body 1 are all subject to physical and electrical protection, such that a failure caused because side walls of a chip come into contact with a metal protrusion of another chip is prevented, avoiding external interference and improving reliability; and the side walls are provided with insulation protection, to avoid electrical leakage and short circuit conditions, thus improving the pass rate of chip mounting.

To make an overall electric field of the packaging structure uniform, a conductivity-enhancing layer 13 may be further provided on the rear face of the silicon-based main body 1. The conductivity-enhancing layer 13 sequentially includes a metal seed layer and a conductive metal layer from top to bottom. The metal seed layer can improve robustness of the conductive metal layer to the silicon-based main body 1. Certainly, the conductivity-enhancing layer 13 may also be made of a conductive polymer material or a conductive nanomaterial that is small in density, easy to process, corrosion resistant, and capable of forming a film in a large area. Preferably, the conductivity of the conductivity-enhancing layer 13 ranges from $10^{-2}$ S/cm to 1 S/cm.

Figure 4A:
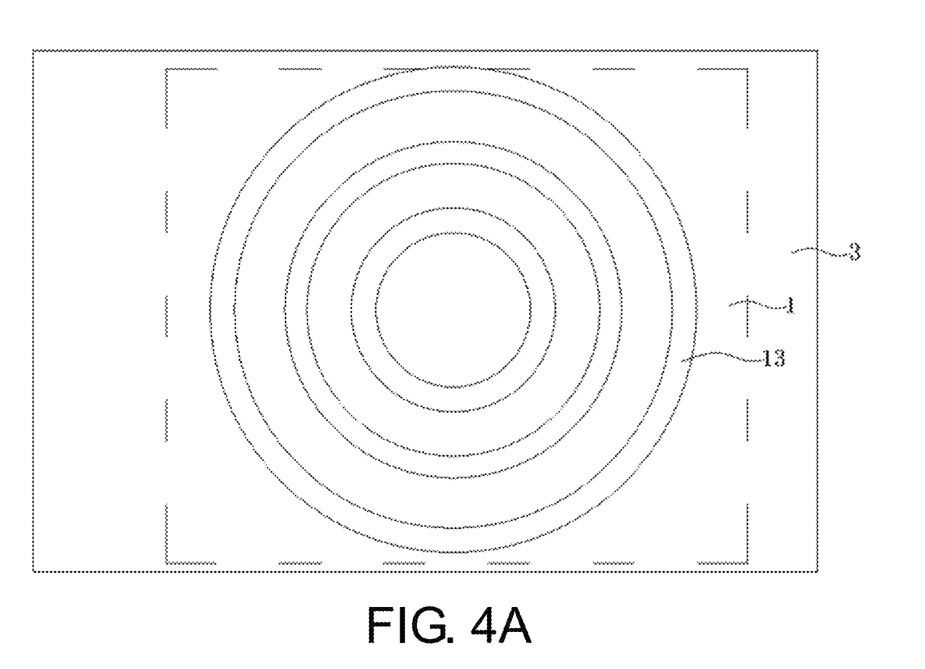
FIG. 4A and FIG. 4B are schematic diagrams of a conductivity-enhancing layer.
Figure 4B:
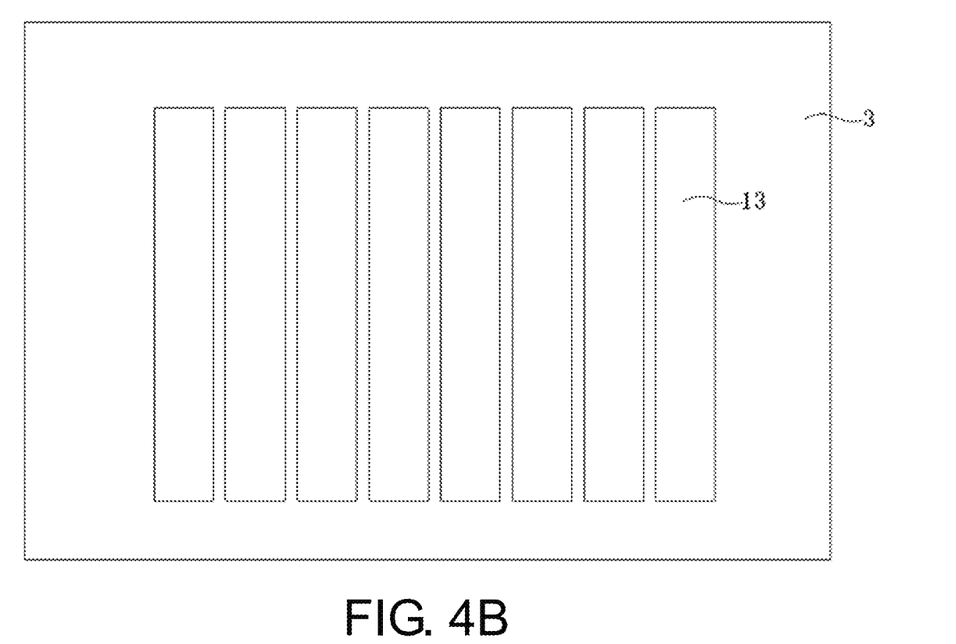

In addition, the conductivity-enhancing layer 13 can completely cover the rear face of the silicon-based main body 1, to make the overall electric field fully uniform. The conductivity-enhancing layer 13 may also partially cover the rear face of the silicon-based main body 1. According to an actual requirement, the conductivity-enhancing layer 13 is designed and formed into a plurality of concentric rings or a plurality of stripes or the like, as shown in FIG. 4A and FIG. 4B, such that a desirable function is achieved while the design requirement is met, improving reliability and reducing material costs.

The chip packaging structure of the present invention uses an advanced wafer level process, and a packaging structure having an overall thickness of 50-300 micrometers can be obtained, which is much thinner, lighter and smaller than a conventional packaging structure.

Figure 5A:
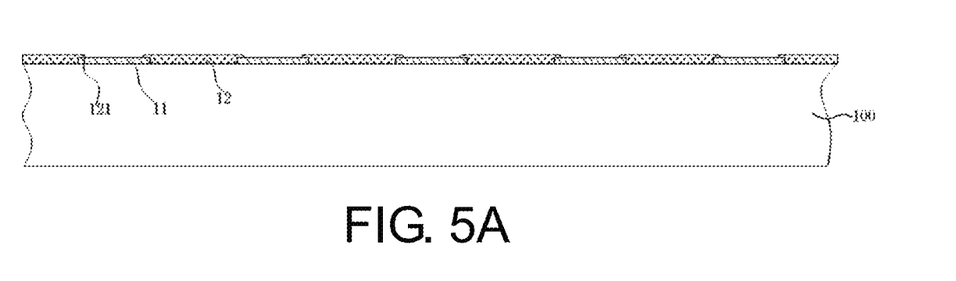
FIG. 5A to FIG. 5L are flow diagrams of the packaging method in the embodiment in FIG. 3A.

The present invention provides a packaging method of a chip packaging structure. Referring to FIG. 5A to FIG. 5K, a process of the packaging method includes the following steps:

Step 1: Referring to FIG. 5A, obtain an integrated circuit wafer 100, where chip electrodes 11 and a corresponding circuit layout are provided on a surface thereof, and passivation layer openings 121 are provided, above the chip electrodes 11, on a passivation layer 12 covering an upper surface of the wafer 100 and front faces of the chip electrodes 11 are exposed through the openings.

Figure 5B:
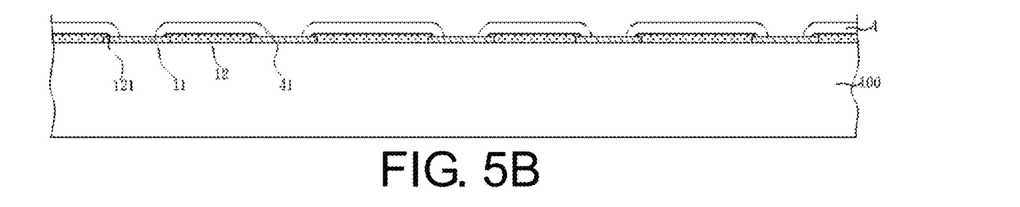

Step 2: Referring to FIG. 5B, provide a dielectric layer 4 and make dielectric layer openings 41 on a surface of the wafer 100 by using a photolithography process, where The front faces of the chip electrodes 11 are also exposed through the dielectric layer openings 41.

Figure 5C:
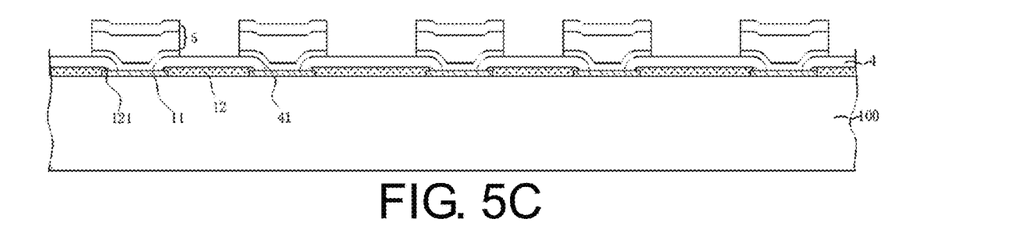

Step 3: Referring to FIG. 5C, deposit a metal seed layer 51 on the surface of the wafer 100 by using a sputtering method or an electroless plating method, then provide metal columns 53 on the front faces of the chip electrodes and solder layers 55 at the top of the metal columns 53 by sequentially using a photolithography process and an electroplating process, remove a remaining photoresist, and remove through corrosion the metal seed layer which is outside the extent of the metal columns 53 and useless, to form metal protrusion structures 5.

Figure 5D:
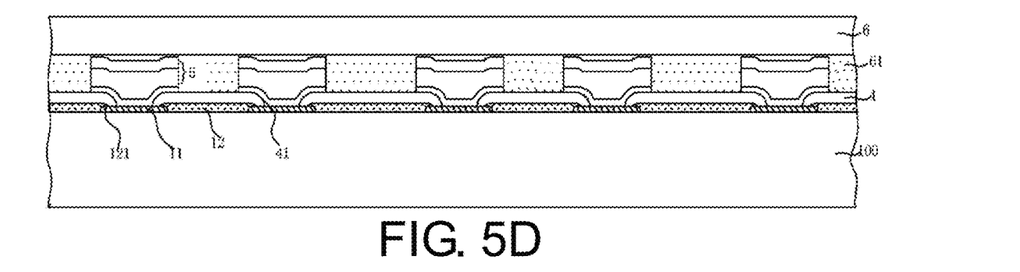
Figure 5E:
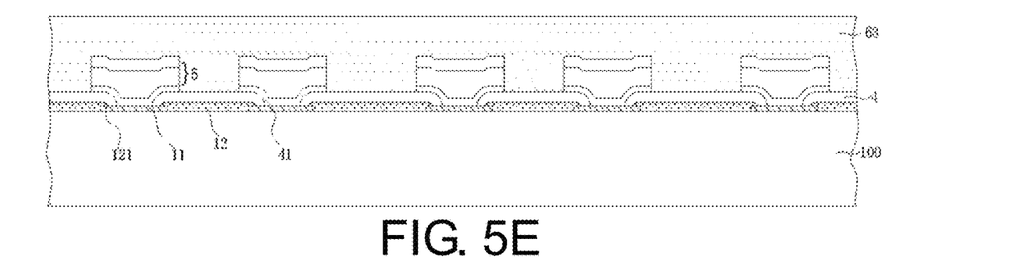

Step 4: Referring to FIG. 5D, perform temporary bonding, on a front face of the wafer 100, of a support 6 having the same size as the front face of the wafer 100. The support 6 may be a silicon-based reinforcing plate such as a silicon sheet or may be a glass-based support such as a glass sheet. The front face of the wafer 100 is connected to the support 6 by using a temporary bonding adhesive 61, referring to FIG. 5D. A temporary bonding film 63 may also be used for the temporary bonding. The temporary bonding film may be a thermo-sensitive thermal release film or a UV release film. The metal protrusion structures 5 are immersed in the temporary bonding film 63, referring to FIG. 5E. Temporary bonding facilitates a thin-wafer process and reduces the risk of debris.

Figure 5F:
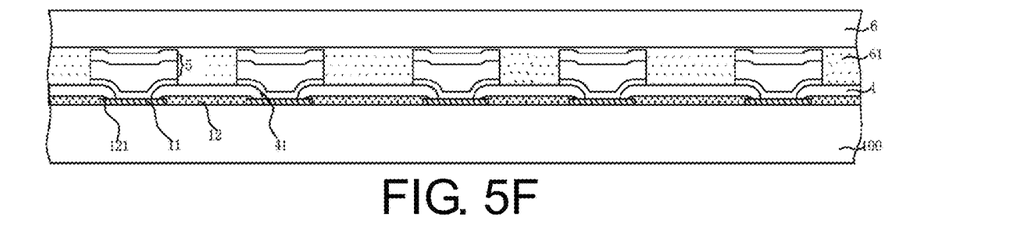

Step 5: Referring to FIG. 5F, perform a thinning process on a rear face of the wafer 100 by using a physical grinding method or a wet etching method, where a thickness by which the wafer 100 is thinned is determined according to an actual situation.

Figure 5G:
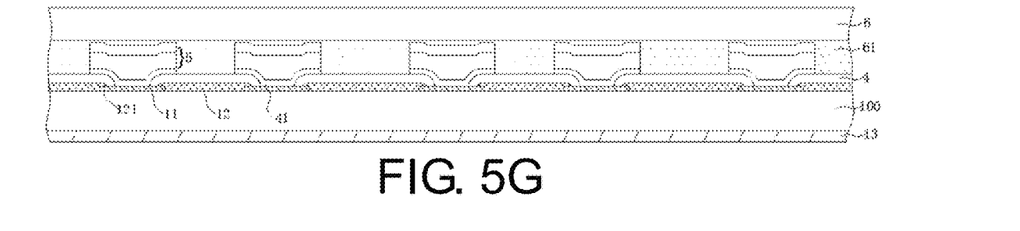

Step 6: Referring to FIG. 5G, form a conductivity-enhancing layer 13 on the rear face of the thinned wafer 100. For the conductivity-enhancing layer 13, a metal seed layer may be first formed by using an evaporation method, and then a conductive metal layer is formed on the metal seed layer through evaporation; alternatively, it may be implemented by printing using a conductive polymer material or a conductive nanomaterial. In either manner, the conductivity-enhancing layer 13 can completely cover the rear face of the silicon-based main body 1 or partially cover the rear face of the silicon-based main body 1 and be formed into a plurality of concentric rings or a plurality of stripes, as shown in FIG. 4A and FIG. 4B.

Figure 5H:
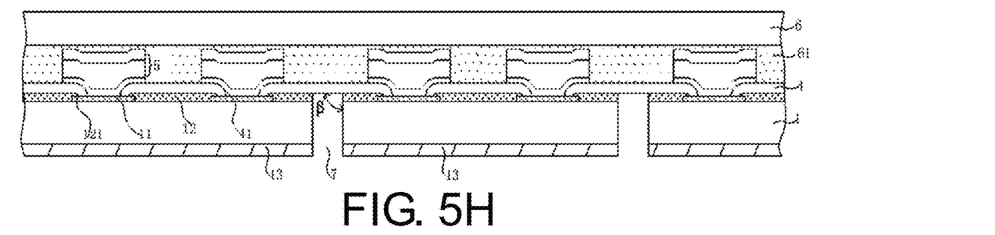

Step 7: Referring to FIG. 5H, form recesses 7 along the direction of scribe lines by sequentially using photolithography, dry or wet etching, and photoresist stripping processes. A position of the bottom of the recess 7 is lower than the bottom of a circuit of the chip electrode 11 in a vertical direction. Preferably, the recesses 7 penetrate the wafer 100 in a depth direction, so that the recesses 7 have a sufficient depth, to divide the wafer 100 into a plurality of silicone based units 1. An angle between a wall and the bottom of the recess (7) is $\beta$, and a value range of the angle $\beta$ is $60°\leq\beta\leq120°$. Generally, the width of the bottom of the recess 7 needs to be smaller than a gap between active areas in neighboring chips, to prevent damage to a circuit of the chip. Therefore, preferably, the value range of the angle $\beta$ between the wall and the bottom of the recess 7 is $90°\leq\beta\leq120°$.

Figure 5I:
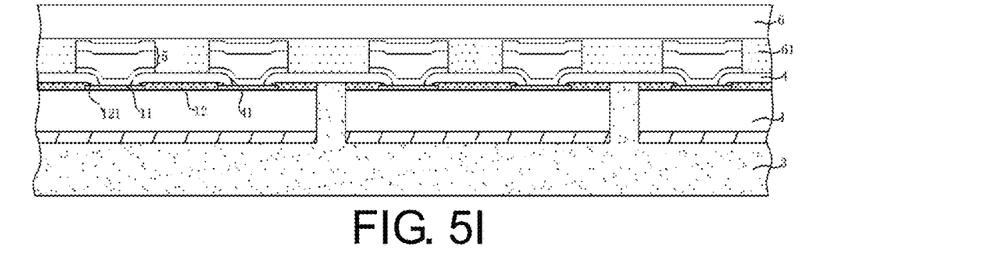

Step 8: Referring to FIG. 5I, in a vacuum, on the rear face of the wafer 100 on which the recesses 7 are formed, inject mold an encapsulation material by using an injection molding process, or coating an encapsulation film by using a film coating process, to form an encapsulation layer 3, where the encapsulation layer 3 completely covers the side walls and the rear face of the silicon-based main body 1, to form an encapsulation body protected by the encapsulation layer.

Figure 5J:
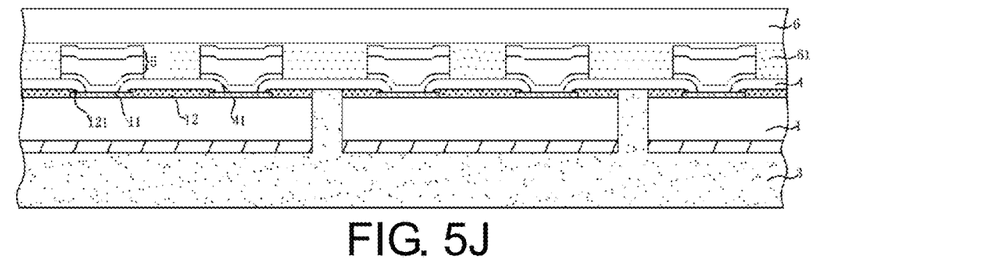

Step 9: Referring to FIG. 5J, form a rear face protective layer 8 on a rear face of the encapsulation layer 3 by using a printing process or a film coating process.

Figure 5K:
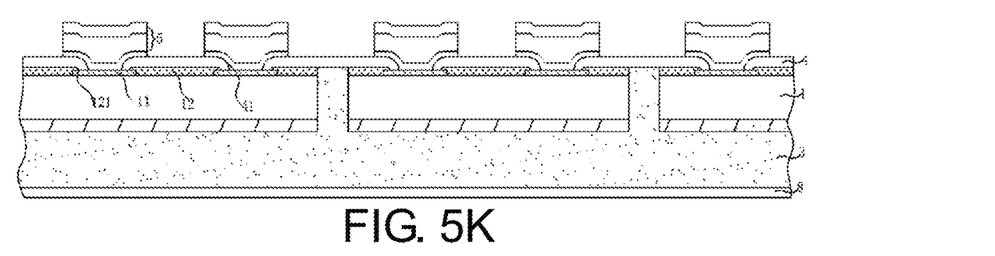

Step 10: Referring to FIG. 5K, remove the bonded support 6, and clean an upper surface of the packaging structure in the step 3, to remove a residue, and expose the metal protrusion structures 5.

Figure 5L:
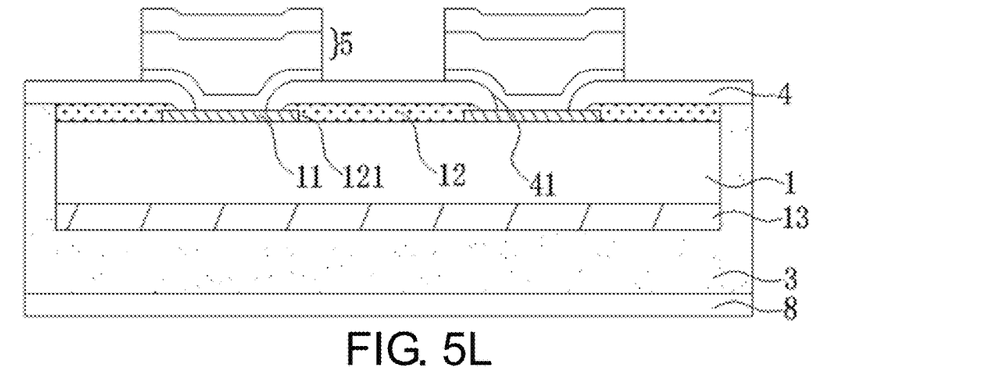

Step 11: Referring to FIG. 5L, cut the packaging structure in the step 8 along the scribe lines again, to form a plurality of independent packaging units.

In the foregoing technical process, in the step 6, the recesses 7 are provided to divide the wafer into the silicone based units 1. Compared with conventional blade cutting or laser cutting, such a method achieves higher production efficiency, and a shape of the recess 7 formed through etching is controllable, a side wall of the recess 7 may be vertical or tilted, and the width of the recess 7 may be adjusted and controlled by using only a photolithographic opening. In addition, relatively small stress is generated when the wafer is divided into the silicone based units 1 through etching, and the side wall of the generated recess is rough to some extent, which can increase a bonding force between the side wall and the encapsulation layer 3. If a cutting manner is used, stress is caused to the relatively thin wafer 100, cracking easily occurs, a cutting depth cannot be well controlled, insufficient cutting or overcutting may be caused, and for the relatively small chip, it takes a relatively long time to cut the entire wafer, reducing productivity.

In the step 7, the encapsulation layer 3 is formed under pressure by inject molding the encapsulation material or by coating the encapsulation film, to further form the encapsulation body protected by the encapsulation layer. Compared with forming, by coating a protective glue, an encapsulation body protected by the protective glue, the method of the present invention is simpler in process and the covered wafer has a very flat surface. The glue coating manner is easy to cause insufficient coverage, and an uneven surface of the wafer is also easily caused. If a large amount of glue is applied first and then the surface is flattened, a waste of the glue is caused on the one hand, and the process is complex on the other hand. In addition, after forming the recesses 7, the method of the present invention further includes a step of: forming a sealed connection structure having a dot shape, a zigzag shape, or a step shape at the bottom and/or on a wall of the recess 7 by using a laser process or an etching process, to increase connection strength between the encapsulation layer 3 and the dielectric layer 4 and between the encapsulation layer 3 and the silicon-based main body 1.

In addition, in the step 6 and the step 7, the recesses are etched to first divide the wafer 100 into the plurality of silicon-based main bodies 1, and then the chip packaging structure employing protection in the surrounding and a rear face is obtained by inject molding the encapsulation material or by coating the encapsulation film. Compared with an existing side wall protection technique such as a fan-out packaging technique, such a manner has a more efficient process and significantly reduced costs. In the existing side wall protection technique, generally, wafer reconfiguration needs to be performed first, and then side walls of a chip are protected by covering the chip. Before the wafer reconfiguration, the wafer needs to be thinned and cut into individual units, and there is a particular chip offset after the wafer reconfiguration is completed, which will inevitably cause a problem to subsequent lithography alignment. Especially for a small chip, if side wall protection is implemented with the existing process, the wafer needs to be loaded first, which takes a long time and wastes the production efficiency of a machine. However, in the method of the present invention, the wafer is divided into individual units by using an etching method of recesses to implement side wall protection, so that wafer reconfiguration is avoided and there is no problem of a chip offset.

The chip packaging structure and the packaging method thereof of the present invention are not limited to the foregoing preferred embodiments. The application of such packaging can also be extended to many different fields such as the wireless or optical field, but is not limited thereto. Any variation, equivalent change, and modification made by a person skilled in the art to the foregoing embodiments based on the technical essence of the present invention without departing from the spirit and scope of the present invention shall fall within the protection scope defined by the claims of the present invention.

What is claimed is:

1. A chip packaging structure, comprising a silicon-based main body and chip electrodes, wherein the silicon-based main body is provided with a passivation layer on a front face of the silicon-based main body and passivation layer openings are provided on the passivation layer; the chip electrodes have rear faces embedded in the front face of the silicon-based main body; and front faces of the chip electrodes are exposed through the passivation layer openings, wherein a dielectric layer is provided on an upper surface of the passivation layer, and dielectric layer openings are provided on the dielectric layer; and the front faces of the chip electrodes are also exposed through the dielectric layer openings;

metal protrusion structures are provided on the front faces of the chip electrodes, and are fixedly connected to the chip electrodes; and each of the metal protrusion structures sequentially comprises a metal seed layer, a metal column, and a solder layer from bottom to top;

an angle between a side wall of the silicon-based main body and a horizontal plane in which the chip electrodes are located is $\alpha$, and a value range of the angle $\alpha$ is $60° \leq \alpha \leq 120°$; a conductivity-enhancing layer and an encapsulation layer are provided on a rear face of the silicon-based main body; a rear face protective layer is provided on a rear face of the encapsulation layer; the conductivity-enhancing layer is adhered to the rear face of the silicon-based main body; the encapsulation layer covers the conductivity-enhancing layer and covers the rear face and side walls of the silicon-based main body which are exposed; and the encapsulation layer is integrally formed, and is in a sealed connection to the dielectric layer at an interface between the encapsulation layer and the dielectric layer; and a total thickness H of the chip packaging structure ranges from 50-300 micrometers.

2. The chip packaging structure according to claim 1, wherein a sealed connection structure is provided at the interface between the encapsulation layer and the dielectric layer, and the sealed connection structure has a dot shape, a zigzag shape, or a step shape on the dielectric layer and/or the silicon-based main body.

3. The chip packaging structure according to claim 2, wherein the conductivity-enhancing layer completely covers the rear face of the silicon-based main body.

4. The chip packaging structure according to claim 2, wherein the conductivity-enhancing layer partially covers the rear face of the silicon-based main body, and is formed into a plurality of concentric rings or a plurality of stripes.

5. The chip packaging structure according to claim 1, wherein the conductivity-enhancing layer sequentially comprises a metal seed layer and a conductive metal layer from top to bottom.

6. The chip packaging structure according to claim 5, wherein the conductivity-enhancing layer completely covers the rear face of the silicon-based main body.

7. The chip packaging structure according to claim 5, wherein the conductivity-enhancing layer partially covers the rear face of the silicon-based main body, and is formed into a plurality of concentric rings or a plurality of stripes.

8. The chip packaging structure according to claim 1, wherein the conductivity-enhancing layer is made of a conductive polymer material or a conductive nanomaterial.

9. The chip packaging structure according to claim 8, wherein the conductivity-enhancing layer completely covers the rear face of the silicon-based main body.

10. The chip packaging structure according to claim 8, wherein the conductivity-enhancing layer partially covers the rear face of the silicon-based main body, and is formed into a plurality of concentric rings or a plurality of stripes.

11. The chip packaging structure according to claim 1, wherein the conductivity-enhancing layer completely covers the rear face of the silicon-based main body.

12. The chip packaging structure according to claim 1, wherein the conductivity-enhancing layer partially covers the rear face of the silicon-based main body, and is formed into a plurality of concentric rings or a plurality of stripes.

13. A packaging method of a chip packaging structure, comprising steps as follows:

step 1: obtaining an integrated circuit wafer, wherein chip electrodes and a corresponding circuit layout are provided on a surface of the integrated circuit wafer, and passivation layer openings are provided, above the chip electrodes, on a passivation layer covering an upper surface of the wafer and front faces of the chip electrodes are exposed through the passivation layer openings;

step 2: providing a dielectric layer on a surface of the wafer and making dielectric layer openings on the dielectric layer by using a photolithography process, wherein the front faces of the chip electrodes are also exposed through the dielectric layer openings;

step 3: depositing a metal seed layer on the surface of the wafer by using a sputtering method or an electroless plating method, then providing metal columns on the front faces of the chip electrodes and solder layers at the top of the metal columns by sequentially using a photolithography process and an electroplating process, removing a remaining photoresist, and removing through corrosion the metal seed layer which is outside an extent of metal protrusion structures and useless, to form the metal protrusion structures;

step 4: performing temporary bonding, on a front face of the wafer, of a support having the same size as the front face of the wafer, wherein the support is a silicon-based reinforcing plate or a glass-based support;

step 5: performing a thinning process on a rear face of the wafer by using a physical grinding method or a wet etching method, wherein a thickness by which the wafer is thinned is determined according to an actual situation;

step 6: forming a conductivity-enhancing layer on the rear face of the thinned wafer by using an evaporation method or a printing method;

step 7: forming recesses along a direction of scribe lines by sequentially using photolithography, dry or wet etching, and photoresist stripping processes, wherein a bottom of each of the recesses is lower than a bottom of a circuit of the chip electrodes in a vertical direction, an angle between a wall and the bottom of each of the recesses is $\beta$, and a value range of the angle $\beta$ is $60° \leq \beta \leq 120°$;

step 8: in a vacuum, on the rear face of the wafer on which the recesses are formed, inject molding an encapsulation material by using an injection molding process, or coating an encapsulation film by using a film coating process, to form an encapsulation layer, wherein the encapsulation layer completely covers side walls and a rear face of a silicon-based main body;

step 9: forming a rear face protective layer on a rear face of the encapsulation layer by using a printing process or a film coating process;

step 10: removing the bonded support, and cleaning an upper surface of the chip packaging structure of the step 3, to remove a residue, and expose the metal protrusion structures; and step 11: cutting the chip packaging structure obtained from the foregoing step along the scribe lines, to form a plurality of independent packaging units.

14. The packaging method of a chip packaging structure according to claim 13, wherein in the step 7, the recesses penetrate the wafer in a depth direction, to divide the wafer into a plurality of silicon-based main bodies.

15. The packaging method of a chip packaging structure according to claim 14, wherein in the step 7, after forming the recesses, the method further comprises: forming a sealed connection structure having a dot shape, a zigzag shape, or a step shape at the bottom and/or on the wall of each of the recesses by using a laser process or an etching process.

16. The packaging method of a chip packaging structure according to claim 13, wherein in the step 7, after forming the recesses, the method further comprises: forming a sealed connection structure having a dot shape, a zigzag shape, or a step shape at the bottom and/or on the wall of each of the recesses by using a laser process or an etching process.

\* \* \* \* \*